(12) United States Patent
Chen et al.

(10) Patent No.: US 7,276,406 B2
(45) Date of Patent: Oct. 2, 2007

(54) TRANSISTOR STRUCTURE WITH DUAL TRENCH FOR OPTIMIZED STRESS EFFECT AND METHOD THEREFOR

(75) Inventors: Jian Chen, Austin, TX (US); Michael D. Turner, San Antonio, TX (US); James E. Vasek, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 257 days.

(21) Appl. No.: 10/977,266

(22) Filed: Oct. 29, 2004

(65) Prior Publication Data

US 2006/0091461 A1   May 4, 2006

(51) Int. Cl.
*H01L 21/8238* (2006.01)
(52) U.S. Cl. ............... 438/199; 438/218; 257/E21.546
(58) Field of Classification Search ............... 438/142, 438/197, 199, 200, 207, 294, 296, 424, 425–427, 438/435, 218, 220; 257/E21.545, E21.546, 257/E21.548
See application file for complete search history.

(56) References Cited

U.S. PATENT DOCUMENTS 6,174,784 B1 * 1/2001 Forbes ...................... 438/405
6,482,715 B2   11/2002 Park et al.
6,524,929 B1 * 2/2003 Xiang et al. ................ 438/424

OTHER PUBLICATIONS

International Search Report and Written Opinion.

* cited by examiner

*Primary Examiner*—Brook Kebede
(74) *Attorney, Agent, or Firm*—Michael J. Balconi-Lamica (57) ABSTRACT

A method for forming a portion of a semiconductor device structure comprises providing a semiconductor-on-insulator substrate having a semiconductor active layer, an insulation layer, and a semiconductor substrate. A first isolation trench is formed within the semiconductor active layer and a stressor material is deposited on a bottom of the first trench, wherein the stressor material includes a dual-use film. A second isolation trench is formed within the semiconductor active layer, wherein the second isolation trench is absent of the stressor material on a bottom of the second trench. The presence and absence of stressor material in the first and second isolation trenches, respectively, provides differential stress: (i) on one or more of N-type or P-type devices of the semiconductor device structure, (ii) for one or more of width direction or channel direction orientations, and (iii) to customize stress benefits of one or more of a <100> or <110> semiconductor-on-insulator substrate.

35 Claims, 5 Drawing Sheets

FIG. 1

| CHANNEL ORIENTATION | DEVICE TYPE | FAVORABLE CHANNEL STRESS | FAVORABLE WIDTH STRESS |
|---|---|---|---|
| <110> | NMOS | TENSILE | SMALL SENSITIVITY |
| <110> | PMOS | COMPRESSIVE | TENSILE |
| <100> | NMOS | TENSILE | SMALL SENSITIVITY |
| <100> | PMOS | SMALL SENSITIVITY | SMALL COMPRESSIVE |

TRANSISTOR STRUCTURE WITH DUAL TRENCH FOR OPTIMIZED STRESS EFFECT AND METHOD THEREFOR

RELATED APPLICATIONS

This application is related to U.S. patent application Ser. No. 10/977,226, entitled "SEMICONDUCTOR DEVICE HAVING TRENCH ISOLATION FOR DIFFERENTIAL STRESS AND METHOD THEREFOR" filed concurrently herewith and assigned to the assignee hereof.

BACKGROUND

The present disclosures relate generally to semiconductor devices, and more particularly, to a transistor structure and method of making a transistor structure with dual trench for optimized stress effect on a <100> SOI substrate.

In prior techniques, various forms of trench isolation and nitride deposition are known. However, such known techniques do not address providing differential stress on different types of devices and for different orientations, simultaneously.

Figure 1:
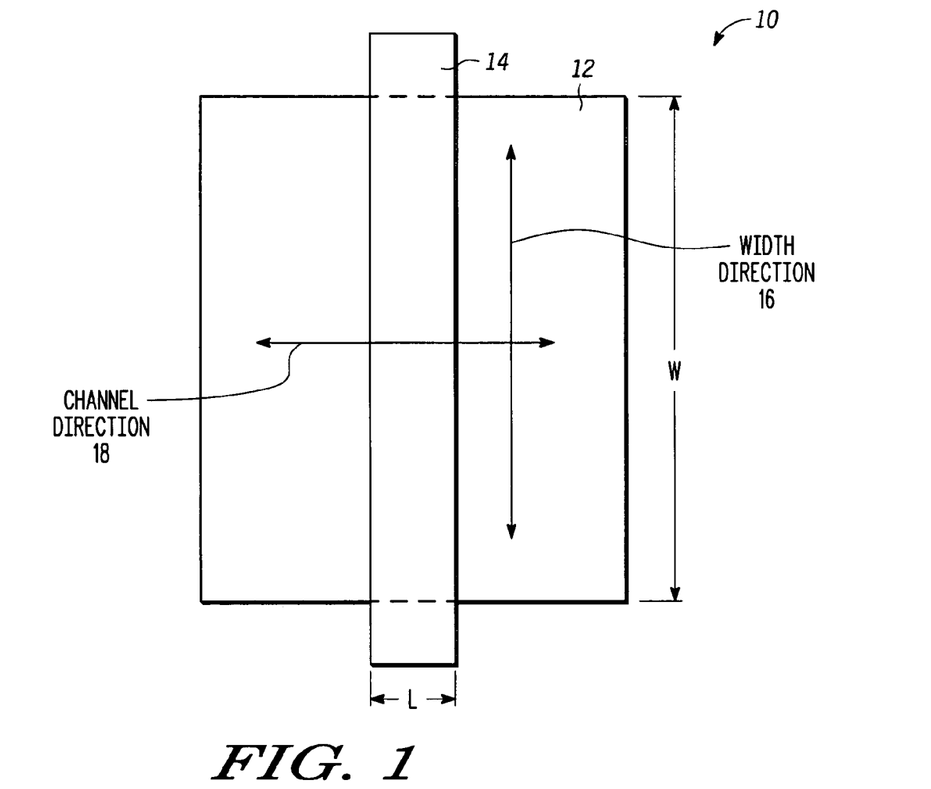
FIG. 1 is a top view of a CMOS transistor illustrating a channel direction and width direction as is known in the art.

FIG. 1 is a top view of a CMOS transistor 10 illustrating a channel direction and width direction as is known in the art. In particular CMOS transistor 10 includes an active region 12 and a gate electrode 14, with an underlying gate dielectric (not shown). Active region 12 is characterized by a width dimension W extending in a width direction, the width direction being indicated by reference numeral 16. In addition, active region 12 comprises any suitable semiconductor material. Gate electrode 14 is characterized by a length dimension L extending in a channel direction, the channel direction being indicated by reference numeral 18.

Accordingly, it would be desirable to provide an improved transistor structure and method of making the same for overcoming the problems in the art.

SUMMARY

According to one embodiment, a method for forming a portion of a semiconductor device structure comprises providing a semiconductor-on-insulator substrate having a semiconductor active layer, an insulation layer, and a semiconductor substrate. A first isolation trench is formed within the semiconductor active layer and a stressor material is deposited on a bottom of the first trench, wherein the stressor material includes a dual-use film. A second isolation trench is formed within the semiconductor active layer, wherein the second isolation trench is absent of the stressor material on a bottom of the second trench. The presence and absence of stressor material in the first and second isolation trenches, respectively, provides differential stress: (i) on one or more of N-type or P-type devices of the semiconductor device structure, (ii) for one or more of width direction or channel direction orientations, and (iii) to customize stress benefits of one or more of a <100> or <110> semiconductor-on-insulator substrate.

BRIEF DESCRIPTION OF THE DRAWINGS

The embodiments of the present disclosure are illustrated by way of example and not limited by the accompanying figures, in which like references indicate similar elements, and in which.

The use of the same reference symbols in different drawings indicates similar or identical items. Skilled artisans will also appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

The embodiments of the present disclosure provide a solution to put differential stress on different devices (N-type and P-type) and different orientations (width direction or length direction) to optimize and maximize the stress benefits of a <100> SOI substrate. For example, the embodiments of the present disclosure make use of trench isolation and a corresponding nitride deposition in selective areas to address a dual (248 nm/193 nm) photo process and differential stress effects, as discussed herein.

According to one embodiment, a dual trench process for SOI comprises forming a nitride layer at the bottom of a desired trench area to prevent trench liner induced compressive stress and thus enabling differential stress on a specific device and orientation. In addition, this method also enables a 248 nm and 193 nm dual trench photo process by providing for an optimized reflectivity for both wavelengths.

Figure 2:
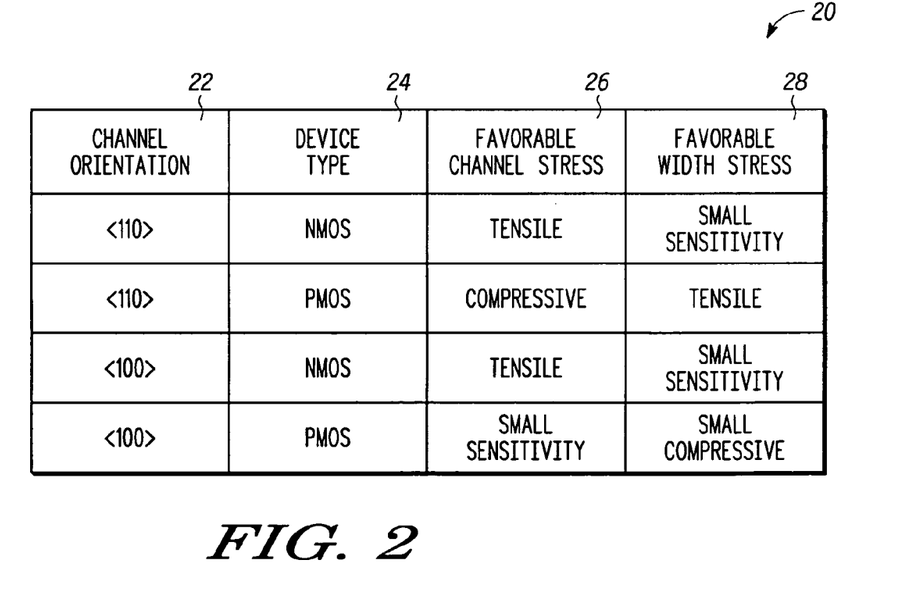
FIG. 2 is a table view of stress response characteristics for various channel orientations and device types.

FIG. 2 is a table view of stress response sensitivity characteristics for various channel orientations and device types. The table is based on short channel device behavior. In particular, the table 20 of FIG. 2 includes columns of channel orientation 22, device type 24, favorable channel stress 26, and favorable width stress 28. For a channel orientation of <110>, an NMOS device performs best under tensile stress in the channel direction. In addition, for a channel orientation of <110>, the NMOS device performance has a relatively small sensitivity to stress in width direction. For a channel orientation of <110>, a PMOS device performs best under compressive stress in the channel direction and under tensile stress in width direction. For a channel orientation of <100>, an NMOS device performs best under tensile stress in the channel direction and has a relatively small sensitivity to stress in width direction. Lastly, for a channel orientation of <100>, a PMOS device performance demonstrates a relatively small sensitivity to stress in the channel direction and does respond favorably to small compressive stress in the width direction.

Figure 3:
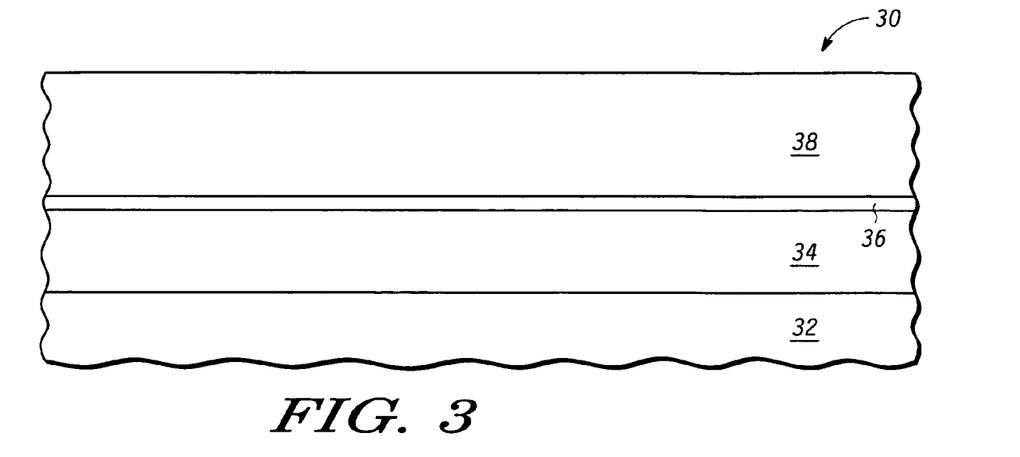
FIGS. 3-7 are cross-sectional views of a semiconductor device manufactured using a dual trench process for optimizing stress effect according to one embodiment of the present disclosure.

FIGS. 3-7 are cross-sectional views of a semiconductor device manufactured using a dual trench process for optimizing stress effects according to one embodiment of the present disclosure. In FIG. 3, semiconductor device 30 includes a semiconductor-on insulator-substrate, for example, a <100> SOI substrate as is known in the art. The SOI substrate includes a silicon substrate (not shown), a buried oxide (BOX) 32 overlying the silicon substrate, and silicon layer 34 overlying the BOX 32. Overlying silicon layer 34 is a thermal oxide 36, for example, a pad oxide. Overlying pad oxide 36 is a silicon nitride layer 38. With respect to the SOI substrate, the BOX 32 has a thickness on the order of 1350-2000 angstroms and the silicon layer 34 has a thickness on the order of 700-1100 angstroms. Pad oxide 36 has a thickness on the order of 90-150 angstroms. Additionally, silicon nitride layer 38 has a thickness on the order of 1000-1200 angstroms. In one embodiment, the silicon nitride layer 38 has a thickness in the range of 1050-1160 angstroms.

Figure 4:
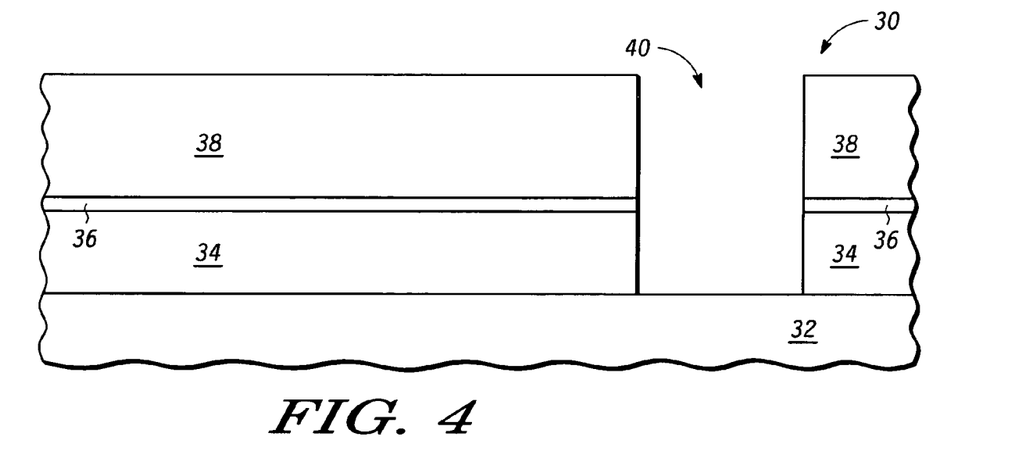

In FIG. 4, a first trench etch is performed to form first trench 40. To form the first trench 40, a first photo process is used. In one embodiment, the first photo process includes, for example, a 248 nm DUV (deep ultra violet) patterning process. Subsequent to the patterning step, an etch step is carried out to form the first trench 40.

Figure 5:
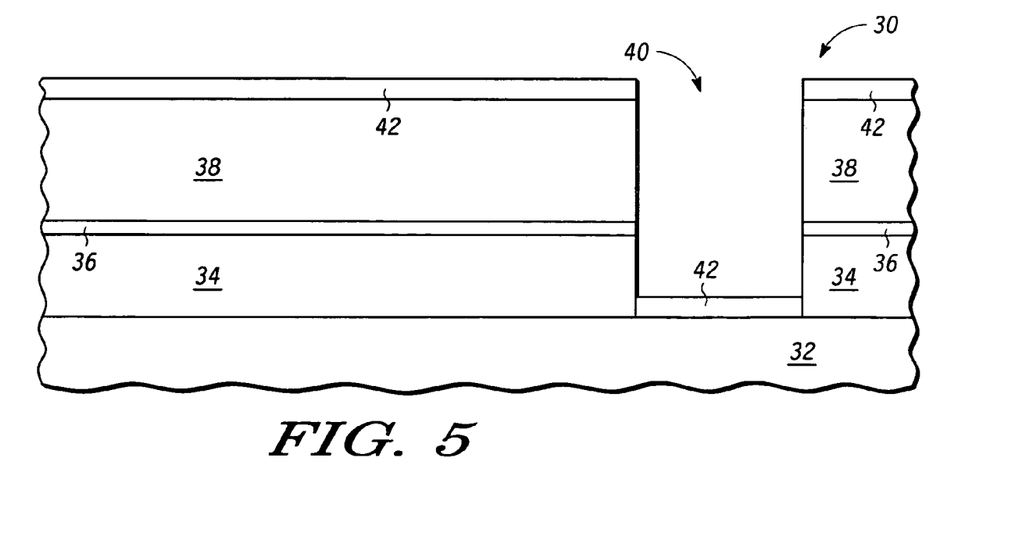

In FIG. 5, subsequent to the first trench etch, a stressor/anti-reflective coating (ARC) film deposition is performed. Forming the stressor/ARC film 42 includes selectively depositing a dual use film. That is, the stressor/ARC film can comprise any suitable film that can perform the dual use of 1) a stressor and 2) an ARC film. In one embodiment, the stressor/ARC film comprises, for example, a nitride. Furthermore, selective deposition of the stressor/ARC film 42 includes depositing the film over the exposed portions of silicon nitride layer 38 and a bottom of the first trench 40.

A possible alternative is to form sidewall spacers in opening 40 as a diffusion barrier instead of deposited layer 42. In such case, it may also be beneficial to extend opening 40 into BOX layer 32 before forming the sidewall spacers, wherein the sidewall spacers block the silicon/BOX interface.

Figure 6:
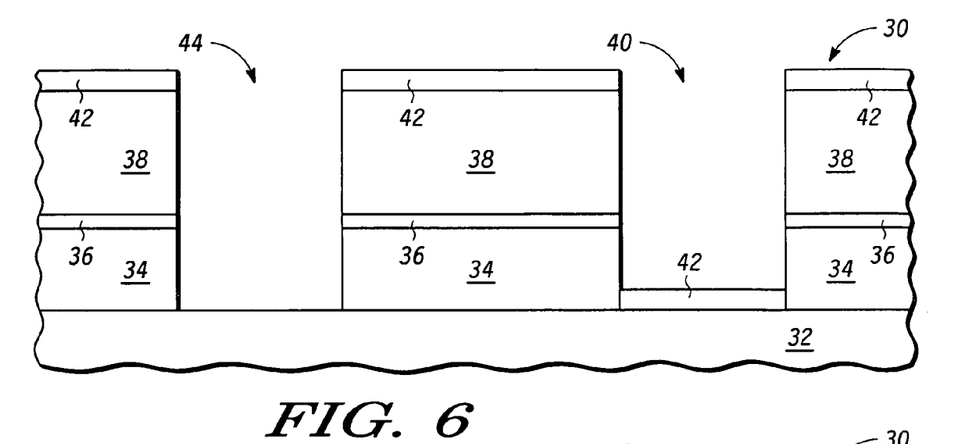

In FIG. 6, a second trench etch is performed to form second trench 44. To form the second trench 44, a second photo process is used. In one embodiment, the second photo process includes, for example, a 193 nm DUV (deep ultra violet) patterning process. Subsequent to the patterning step, an etch step is carried out to form the second trench 44. Unlike the bottom of the first trench, the bottom of the second trench is free of any stressor/ARC film.

Figure 7:
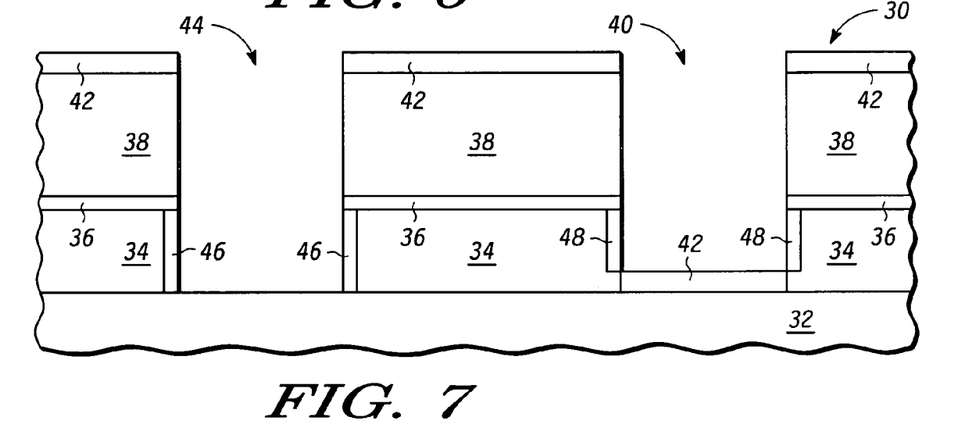

In FIG. 7, trench liners (46,48) are formed in respective first and second trenches (40,44). Trench liners (46,48) include thermally grown liners for driving out defects, and for protecting top corners of the silicon in respective trenches. In the second trench 44, trench liner 46 extends from a top of the silicon 34 within the second trench and completely down to the buried oxide 32. In addition, as a result of the presence of the stressor/ARC film 42 overlying the bottom of the first trench 40, the trench liner 48 is prevented from growing on the silicon 34 within the first trench and completely down to the buried oxide 32. Accordingly, a portion of silicon 34 within the first trench 40 remains protected by the stressor/ARC film 42.

Figure 8:
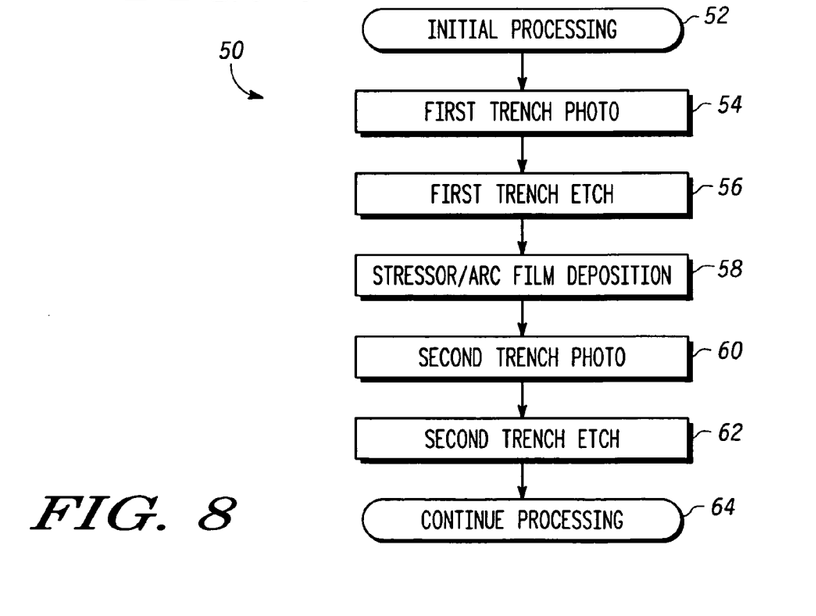
FIG. 8 is a flow diagram view of a dual trench process for optimizing stress effect according to one embodiment of the present disclosure.

FIG. 8 is a flow diagram view 50 of a dual trench process for optimizing stress effect according to one embodiment of the present disclosure. Initial processing takes place in step indicated by reference numeral 52. In step 54, a first trench photo is performed, as discussed herein above with reference to FIG. 4. In step 56, a first trench etch is carried out to form a first trench, further as discussed herein above with reference to FIG. 4. Following the first trench etch, in step 58, a selective dual use (stressor/ARC) film deposition is carried out, for example, as discussed herein above with reference to FIG. 5. In step 60, a second trench photo is performed, as discussed herein above with reference to FIG. 6. In step 62, a second trench etch is carried out to form a second trench, further as discussed herein above with reference to FIG. 6. Following the second trench etch in step 64, continued processing is carried out according to the particular requirements of the semiconductor device to be manufactured. For example, continued processing could include formation of trench liners as discussed herein above with reference to FIG. 7.

Figure 9:
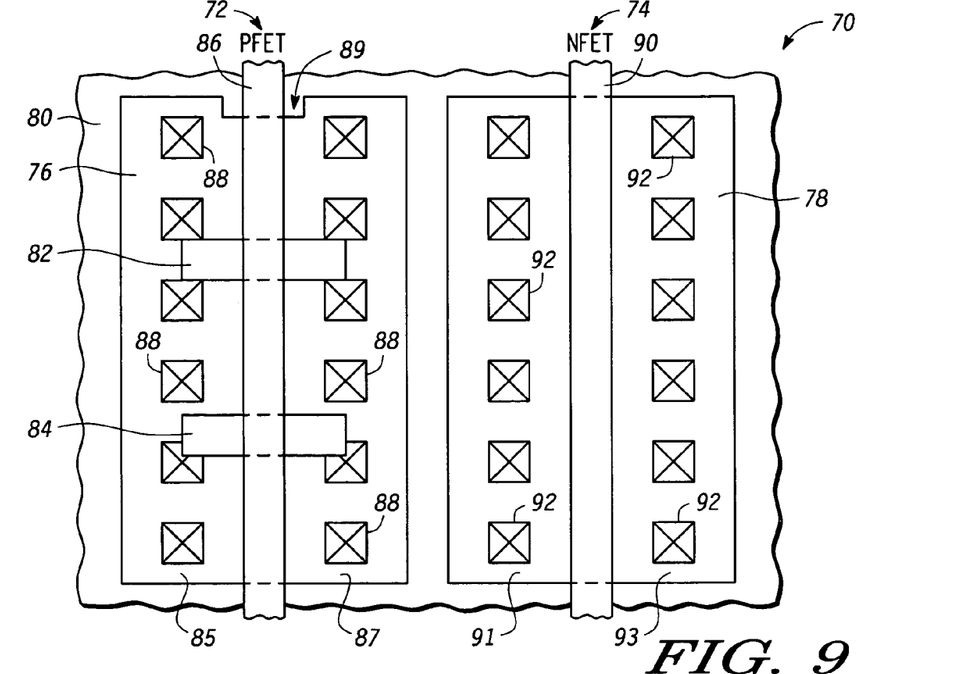
FIG. 9 is a top view of semiconductor device structure, including a CMOS transistor structure with a controlled stress feature in a width direction manufactured using a dual trench process according to one embodiment of the present disclosure.

FIG. 9 is a top view of semiconductor device structure 70, including CMOS transistor structures 72 and 74, wherein structure 72 includes a controlled stress feature in a width direction manufactured using a dual trench process according to one embodiment of the present disclosure as discussed herein above. In one embodiment, CMOS transistor structures 72 and 74 represent a PFET device and an NFET device, respectively. CMOS transistor structures 72 and 74 include active semiconductor regions 76 and 78, respectively. In one embodiment, the active semiconductor regions comprise silicon.

Optimization of PFET CMOS transistor 76 includes the addition of a first stress modifier feature indicated by reference numeral 80 and second stress modifier and capacitive reduction features (82,84), wherein the features provide a modification of stresses in the width direction. The first stress modifier feature comprises a dual use stressor/ARC film external to active semiconductor region 76. In addition, formation of the first stress modifier feature 80 is accomplished via the first trench etch and stressor/ARC file deposition as discussed earlier herein with reference to FIG. 5. In one embodiment, the first stress modifier feature includes nitride.

Furthermore, the stress modifier and capacitive reduction features (82,84) are internal to the active semiconductor area 76, extending between source and drain regions of active area 76. Portions of active area 76 underlie a gate electrode 86 and an associated gate dielectric (not shown). A portion of the stress modifier and capacitive reduction features (82,84) also underlie the gate electrode 86 and associated gate dielectric (not shown). Gate electrode 86 is characterized by a length dimension L extending in a channel direction. In one embodiment, stress modifier and capacitive reduction features (82,84) are formed subsequent to removal of active semiconductor material by the second trench etch, as discussed earlier herein, further as discussed herein above with reference to FIGS. 6 and 7. Stress modifier and capacitive reduction features (82,84) are further characterized by an absence of the dual use stressor/ARC film lining a bottom of a respective trench, further wherein a trench sidewall liner of the respective trenches extends fully within the respective trench, from a top of the active layer material down to an underlying buried oxide.

Further with respect to the first stress modifier feature 80 and stress modifier and capacitive reduction features (82, 84), each further includes a trench fill material. The particular trench fill material is selected according to a desired additional stress modification for a particular transistor application, with respect to either compressive or tensile stress modification. For example, in one embodiment, the trench fill material includes oxide for providing a compressive stress modification. In another embodiment, the trench fill material includes a nitride for providing a tensile stress modification.

With reference still to FIG. 9, PFET CMOS transistor 72 further includes contacts 88 for making contact with source and drain regions, 85 and 87, respectively, of active region 76. With respect to the PFET CMOS transistor 72, the same has been optimized from a performance stand point as further discussed herein.

FIG. 9 further illustrates PFET CMOS transistor 72 with a notch 89 according to another embodiment of the present disclosure. That is, PFET CMOS transistor 72 includes a notch 89 in active region 76. Notch 89 is disposed at one end of active region 76, wherein the notch spans across a portion of the channel region of PFET CMOS transistor 72. With its presence, notch 89 reduces a total width dimension of the active region 76 for addressing various chip functionality issues and/or problems as may be required for a given CMOS transistor application.

FIG. 9 still further illustrates a top view of NFET CMOS transistor 74, wherein transistor 74 includes an active region 78 that underlies a gate electrode 90 and an associated gate dielectric (not shown). Active region 78 is characterized by a width dimension W extending in a width direction and comprises semiconductor material. Gate electrode 90 is characterized by a length dimension L extending in a channel direction. Transistor 74 also includes contacts 92 for making contact with source and drain regions, 91 and 93, respectively of active semiconductor region 78. Note that active region 78 is also surrounded by the first stress modifier feature 80 that is comprised of a dual use stressor/ARC film. Formation of the first stress modifier feature 80 surrounding active region 78 is accomplished during the first trench etch and stressor/ARC file deposition as discussed earlier herein with reference to FIG. 5.

Figure 10:
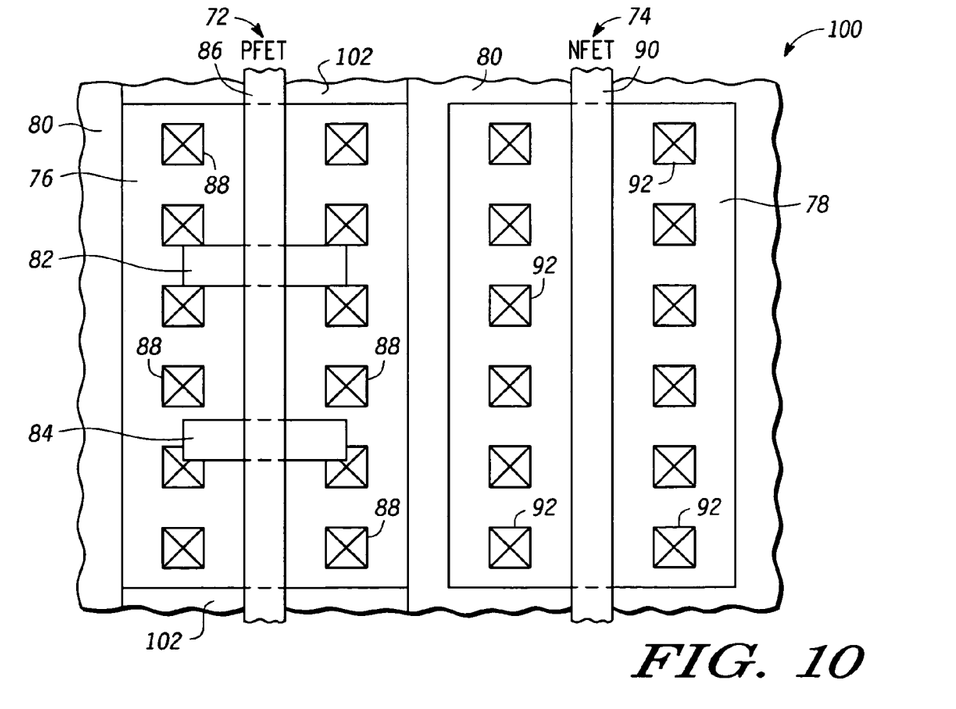
FIG. 10 is a top view of semiconductor device structure, including a CMOS transistor structure with a controlled stress feature in a width direction manufactured using a dual trench process according to another embodiment of the present disclosure.

FIG. 10 is a top view of semiconductor device structure 100, including CMOS transistor structures 72 and 74, wherein structure 72 includes a controlled stress feature in a width direction manufactured using a dual trench process according to another embodiment of the present disclosure as discussed herein above. The embodiment of FIG. 10 is similar to the embodiment discussed herein above with respect to FIG. 9 with the following differences. As shown in FIG. 10, structure 72 further includes third stress modifier and capacitive reduction features 102, wherein the features provide a further modification of stresses in the width direction of structure 72. Third stress modifier and capacitive reduction features 102 are disposed at opposite ends of active area 76, and more particularly, along the edges of the active area that extend in the channel direction.

In one embodiment, the third stress modifier and capacitive reduction features 102 are formed subsequent to removal of active semiconductor material by the second trench etch, as discussed earlier herein with reference to FIGS. 6 and 7. Stress modifier and capacitive reduction features 102 are further characterized by an absence of the dual use stressor/ARC film lining a bottom of a respective trench, further wherein a trench sidewall liner of the respective trenches extends fully within the respective trench, from a top of the active layer material down to an underlying buried oxide.

Further with respect to the first stress modifier feature 80, and stress modifier and capacitive reduction features (82, 84,102), each also includes a trench fill material. The particular trench fill material is selected according to a desired additional stress modification for a particular transistor application, with respect to either compressive or tensile stress modification. For example, in one embodiment, the trench fill material includes oxide for providing a compressive stress modification. In another embodiment, the trench fill material includes a nitride for providing a tensile stress modification.

Figure 11:
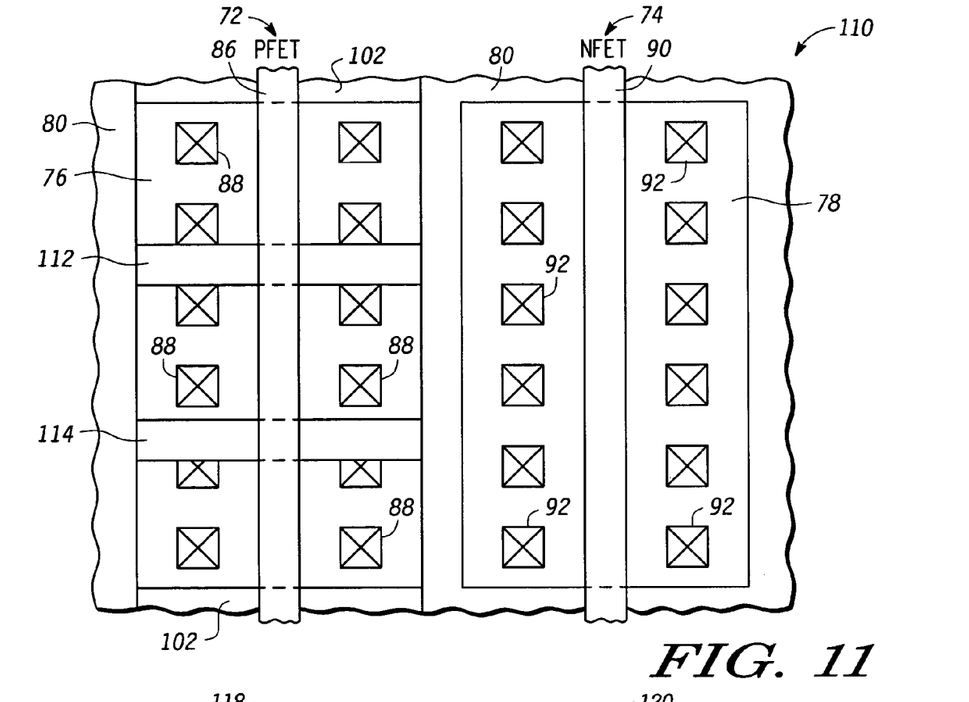
FIG. 11 is a top view of semiconductor device structure, including a CMOS transistor structure with a controlled stress feature in a width direction manufactured using a dual trench process according to yet another embodiment of the present disclosure.

FIG. 11 is a top view of semiconductor device structure 110, including CMOS transistor structures 72 and 74, wherein structure 72 includes a controlled stress feature in a width direction manufactured using a dual trench process according to yet another embodiment of the present disclosure. The embodiment of FIG. 11 is similar to the embodiment discussed herein above with respect to FIG. 9 with the following differences. As shown in FIG. 11, structure 72 further includes alternate stress modifier and capacitive reduction features (112,114), wherein the features provide a further modification of stresses in the width direction of structure 72. Stress modifier and capacitive reduction features (112,114) are disposed across active area 76, and more particularly, fully across the active area and extending in the channel direction. Coupling portions of the active area that are separated by the stress modifier and capacitive reduction features (112,114) can be accomplished using an overlying metallization, for example, a metallization on the contact level or an overlying metal interconnect level.

In one embodiment, stress modifier and capacitive reduction features (112,114) are formed subsequent to removal of active semiconductor material by the second trench etch, as discussed earlier herein with reference to FIGS. 6 and 7. Stress modifier and capacitive reduction features (112,114) are further characterized by an absence of the dual use stressor/ARC film lining a bottom of a respective trench, further wherein a trench sidewall liner of the respective trenches extends fully within the respective trench, from a top of the active layer material down to an underlying buried oxide.

Further with respect to the first stress modifier feature 80, and stress modifier and capacitive reduction features (112, 114, and 102), each also includes a trench fill material. The particular trench fill material is selected according to a desired additional stress modification for a particular transistor application, with respect to either compressive or tensile stress modification. For example, in one embodiment, the trench fill material includes oxide for providing a compressive stress modification. In another embodiment, the trench fill material includes a nitride for providing a tensile stress modification.

Figure 12:
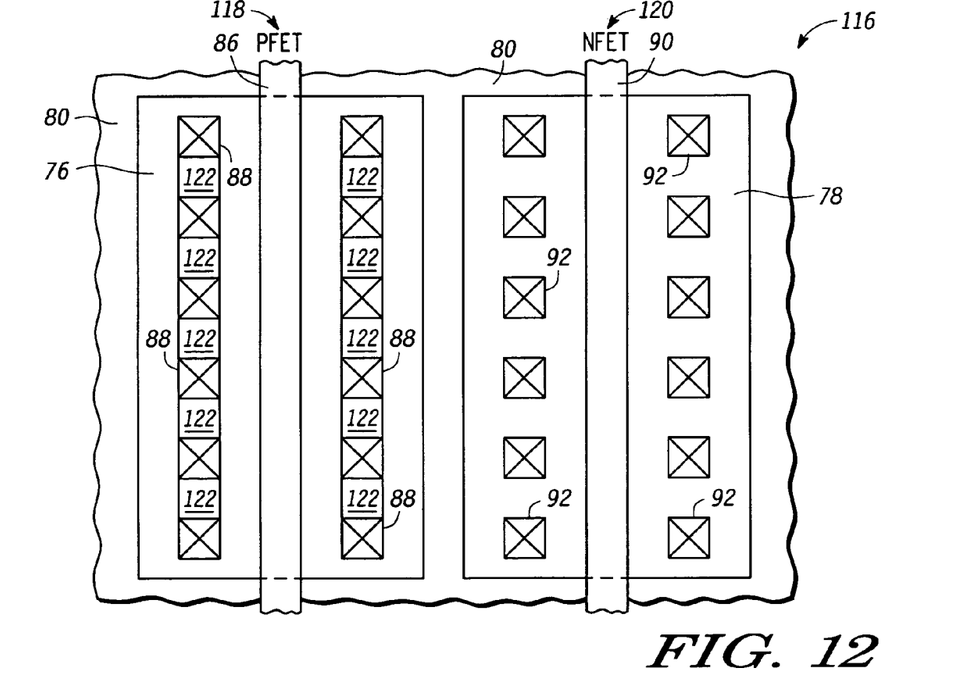
FIG. 12 is a top view of semiconductor device structure, including a CMOS transistor structure with a controlled stress feature in a width direction manufactured using a dual trench process according to still another embodiment of the present disclosure.

FIG. 12 is a top view of semiconductor device structure 116, including CMOS transistor structures 118 and 120 with a controlled stress feature in a channel direction manufactured using a dual trench process according to still another embodiment of the present disclosure. The embodiment of FIG. 12 is similar to the embodiment discussed herein above with respect to FIG. 9 with the following differences as discussed below. For example, with the starting substrate comprising a <110> SOI substrate, a more compressive stress is desired to provide favorable channel stress.

In one embodiment, stress modifier and capacitive reduction features 122 are formed subsequent to removal of active semiconductor material by the second trench etch, as discussed earlier herein, with reference to FIGS. 6 and 7. Stress modifier and capacitive reduction features 122 are further characterized by an absence of the dual use stressor/ARC film lining a bottom of a respective trench, further wherein a trench sidewall liner of the respective trenches extends fully within the respective trench, from a top of the active layer material down to an underlying buried oxide. As illustrated in FIG. 12, stress modifier and capacitive reduction features 122 for the channel direction are contained within respective portions of the source/drain regions of the active area 76 alone, without extending fully across the channel region nor underlying gate electrode 86 and an associated gate dielectric (not shown). In addition, the plurality of stress modifier and capacitive reduction features 122 are disposed parallel to and along the gate electrode 86.

Further with respect to the first stress modifier feature 80, and stress modifier and capacitive reduction features 122, each further includes a trench fill material. The particular trench fill material is selected according to a desired additional stress modification for a particular transistor application, with respect to either compressive or tensile stress modification. For example, in one embodiment, the trench fill material includes oxide for providing a compressive stress modification. In another embodiment, the trench fill material includes a nitride for providing a tensile stress modification.

In one embodiment, the method includes using a selective nitride deposition in a dual trench process. The selective nitride deposition not only enables the dual (248 nm/193 nm) dual photo process, but also provides differential stress on NFET and PFET devices and on width and channel directions to obtain a maximized stress effect on a <100> crystal orientation SOI substrate. That is, the nitride deposition step enables the 248 nm/193 nm dual trench photo process and also provides a selective trench stress manipulation. In other words, the embodiments of present disclosure concurrently provide for addressing the different ARC requirements of both 248 nm and 193 nm photo processes while achieving an optimized stress effect at the same time.

With the embodiments of the present disclosure, the dual trench approach (e.g. a dual mask approach) enables providing an optimized stress (i.e., providing the most beneficial stresses) for both NFET and PFET devices concurrently in both width and channel directions. Accordingly, a performance improvement for the corresponding transistor structure on the order of approximately 5-7% is expected.

In the dual mask approach according to one embodiment, a normal active area and trench patterning at the edge of the active area are patterned using a 248 nm mask and then etched. A thin nitride layer (e.g., SiN) is then selectively deposited on top of the patterned active area (i.e., to enable a 193 nm photo process) and at the bottom of the trenches formed during trench patterning (i.e., to reduce compressive stress). Subsequently, one or more fully enclosed cutout patterns (i.e., within the active region of the PFET device) are patterned using a 193 nm photo process. In this way, the PFET device alone is provided with high compressive stress in a width direction. In addition, the NFET device (i.e., in both width and channel directions) and the PFET device (i.e., in a channel direction) will get less compressive or tensile stress, which is optimal for both the NFET and PFET devices.

It is noted that stress engineering is currently one of the most active areas for high performance CMOS technology development. In addition, SOI substrates have some unique stress effects. The embodiments of the present disclosure provide a unique way to take the advantage of these effects. Furthermore, the dual trench process enables differential and optimized stress effect tailoring stress for specific devices on an SOI substrate, for example, an <100> SOI substrate. Moreover, differential and optimized stress tailoring includes providing more or less stress, tensile or compressive, to different areas and/or regions, as discussed herein.

As discussed herein, the embodiments of the present disclosure are applicable to SOI products requiring high performance and/or low dynamic power. The embodiments further provide method for obtaining a desired performance advantage that is simpler to implement than more complicated methods of using SiGe stressors or c-SiGe channels, etc.

In the foregoing specification, the disclosure has been described with reference to various embodiments. However, one of ordinary skill in the art appreciates that various modifications and changes can be made without departing from the scope of the present embodiments as set forth in the claims below. Accordingly, the specification and figures are to be regarded in an illustrative rather than a restrictive sense, and all such modifications are intended to be included within the scope of the present embodiments. For example, the present embodiments can apply to semiconductor device technologies where carrier mobility is crucial to the device performance.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the term "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method for forming a portion of a semiconductor device structure comprising:
   providing a semiconductor-on-insulator substrate having a semiconductor active layer, an insulation layer, and a semiconductor substrate;
   forming a first isolation trench within the semiconductor active layer,
   depositing a stressor material on a bottom of the first isolation trench, wherein the stressor material includes a dual-use film; and
   forming a second isolation trench within the semiconductor active layer, wherein the second isolation trench is absent of the stressor material on a bottom of the second trench, and wherein the presence and absence of stressor material in the first and second isolation trenches, respectively, provides differential stress: (i) on one or more of N-type or P-type devices of the semiconductor device structure, (ii) for one or more of width direction or channel direction orientations, and (iii) to customize stress benefits of one or more of a <100> or <110> channel orientation of the semiconductor-on-insulator substrate.

2. The method of claim 1, wherein the dual-use film comprises a nitride layer formed at the bottom of the first isolation trench to prevent a trench liner induced compressive stress and to enable differential stress on a specific device and orientation.

3. The method of claim 1, wherein forming the first isolation trench and forming the second isolation trench comprises using a 248 nm and a 193 nm dual trench photo process, respectively, wherein the dual-use film provides an optimized reflectivity for both wavelengths.

4. The method of claim 1, wherein forming the first isolation trench includes using a first wavelength patterning and etch process.

5. The method of claim 4, further wherein the first wavelength patterning and etch process includes a 248 nm deep ultra violet patterning and etch process.

6. The method of claim 1, wherein the semiconductor-on-insulator substrate further includes a pad oxide layer overlying the semiconductor active layer and a silicon nitride layer overlying the pad oxide layer, wherein forming the first isolation trench further includes forming the first isolation trench through the silicon nitride layer, the pad oxide, and the semiconductor active layer, and wherein depositing the stressor material includes selectively depositing the dual-use film overlying a bottom of the first isolation trench and overlying a remainder of the silicon nitride layer.

7. The method of claim 1, wherein the dual-use film comprises a material suitable for use as a stressor material and as an anti-reflective coating.

8. The method of claim 7, further wherein the dual-use film comprises a nitride.

9. The method of claim 1, wherein forming the second isolation trench includes using a second wavelength patterning and etch process, wherein the second wavelength is a wavelength different from the first wavelength.

10. The method of claim 9, wherein the second wavelength patterning and etch process includes a 193 nm deep ultra violet patterning process.

11. The method of claim 1, further comprising:
forming trench liners in respective ones of the first and second isolation trenches along sidewall portions of the first and second isolation trenches.

12. The method of claim 11, wherein the dual-use film overlying the bottom of the first isolation trench prevents a trench liner in the first isolation trench from extending completely along the sidewall of the first isolation trench, the trench liner extending from a top portion of the sidewall to a lower sidewall portion, where the lower sidewall portion contacts a top portion of the dual-use film within the first isolation trench.

13. The method of claim 11, wherein the trench liner in the second isolation trench extends completely along the sidewall of the second isolation trench, from a top portion of the sidewall to a bottom portion of the sidewall.

14. The method of claim 11, wherein the trench liners comprise thermally grown liners.

15. A method for forming a portion of a semiconductor device structure comprising:
providing a semiconductor-on-insulator substrate having a semiconductor active layer, an insulation layer, and a semiconductor substrate;
forming a first isolation trench within the semiconductor active layer,
depositing a stressor material on a bottom of the first isolation trench, wherein the stressor material includes a dual-use film; and
forming a second isolation trench within the semiconductor active layer, wherein the second isolation trench is absent of the stressor material on a bottom of the second isolation trench, and wherein the presence and absence of stressor material in the first and second isolation trenches, respectively, provides differential stress: (i) on one or more of N-type or P-type devices of the semiconductor device structure, (ii) for one or more of width direction or channel direction orientations, and (iii) to customize stress benefits of one or more of a <100> or <110> channel orientation of the semiconductor-on-insulator substrate, wherein the portion of the semiconductor device structure includes first and second transistor structures with first and second active semiconductor regions within the semiconductor active layer, respectively, the first transistor structure including a controlled stress feature in a width direction of the first transistor structure.

16. The method of claim 15, wherein the first transistor structure is a PFET and the second transistor structure is an NFET.

17. The method of claim 15, wherein the controlled stress feature of the first transistor structure includes first and second stress modifier features for providing modification of stresses in the width direction of the first transistor structure.

18. The method of claim 17, wherein the first stress modifier feature includes a dual-use film external to the active semiconductor region of the first transistor structure, the dual-use film further being disposed along a bottom of third and fourth trenches adjacent at least two side portions of the first active semiconductor region of the first transistor structure.

19. The method of claim 17, wherein the second stress modifier feature includes at least one stress modifier and capacitive reduction feature internal to the active semiconductor region of the first transistor structure.

20. The method of claim 19, further wherein the at least one stress modifier and capacitive reduction feature extends between a source region and a drain region of the active semiconductor region of the first transistor structure.

21. The method of claim 19, wherein the second stress modifier feature further comprises a trench with an absence of a dual-use stressor and anti-reflective coating film on a bottom of the respective trench.

22. The method of claim 17, wherein the first and second stress modifier features comprise a plurality of trenches including a trench fill material.

23. The method of claim 22, wherein the trench fill material comprises a material selected according to a desired additional stress modification for a particular transistor application with respect to either a compressive or a tensile stress modification.

24. The method of claim 22, wherein the trench fill material includes oxide for providing a compressive stress modification.

25. The method of claim 22, wherein the trench fill material includes a nitride for providing a tensile stress modification.

26. The method of claim 22, wherein an active semiconductor region of the first transistor structure further includes a notch disposed at an end of the first active semiconductor region, the notch spanning between a source region and a drain region of the first active semiconductor region.

27. The method of claim 17, wherein the first active semiconductor region is bounded by the first stress modifier feature, further wherein the first stress modifier feature includes an isolation trench having a dual-use stressor and anti-reflective coating film on a bottom of the isolation trench.

28. The method of claim 17, wherein the controlled stress feature of the first transistor structure further includes third stress modifier and capacitive reduction features, wherein the third stress modifier and capacitive reduction features provide a further modification of stresses in the width direction of first transistor structure, wherein the third stress modifier and capacitive reduction features are disposed at opposite ends along edges of the active semiconductor region extending in a channel direction of the first transistor structure.

29. The method of claim 17, wherein the controlled stress feature of the first transistor structure further includes alternate stress modifier and capacitive reduction features, wherein the alternate stress modifier and capacitive reduction features provide a further modification of stresses in the width direction of the portion of the semiconductor device structure.

30. The method of claim 29, wherein the alternate stress modifier and capacitive reduction features are disposed completely across the active semiconductor region extending in a channel direction.

31. The method of claim 30, further comprising:
coupling portions of the active semiconductor region that are separated by the stress modifier and capacitive reduction features using an overlying metallization or an overlying metal interconnect level.

32. The method of claim 29, further wherein the alternate stress modifier and capacitive reduction feature comprises a trench with an absence of the dual-use stressor and anti-reflective coating film lining a bottom of the respective trench, further wherein a trench sidewall liner of the respective trench extends fully within the respective trench, from a top of the semiconductor active layer down to the underlying insulation layer.

33. The method of claim 15, wherein the semiconductor active layer has a <110> crystal orientation.

34. The method of claim 33, further comprising:
providing a plurality of stress modifier and capacitive reduction features contained within portions of source/drain regions of the active semiconductor region alone, without extending across a channel region of the active semiconductor region.

35. The method of claim 34, further wherein the plurality of stress modifier and capacitive reduction features are disposed parallel to and along a gate electrode of the first transistor structure, and wherein the plurality of stress modifier and capacitive reduction features provide a modification of stresses in the channel direction of the first transistor structure.

* * * * *